(12) United States Patent
Divakaruni et al.

(10) Patent No.: US 6,245,651 B1
(45) Date of Patent: Jun. 12, 2001

(54) METHOD OF SIMULTANEOUSLY FORMING A LINE INTERCONNECT AND A BORDERLESS CONTACT TO DIFFUSION

(75) Inventors: Rama Divakaruni, Somers, NY (US); Larry Alan Nesbit, Farmington, CT (US); Carl John Radens, LaGrangeville, NY (US)

(73) Assignee: Intenational Business Machines Corporation, Armonk, NY (US)

( * ) Notice: Subject to any disclaimer, the term of this patent is extended or adjusted under 35 U.S.C. 154(b) by 0 days.

(21) Appl. No.: 09/481,916

(22) Filed: Jan. 12, 2000

(51) Int. Cl.⁷ .............................................. H01L 21/3205
(52) U.S. Cl. ............................................................ 438/587
(58) Field of Search ..................... 438/587, 588, 438/585, 596–618, 620, 624, 637, 639, 586–95, 355, 363, 233

(56) References Cited

U.S. PATENT DOCUMENTS 5,792,703 * 8/1998 Bronner et al. ...................... 438/620
5,899,742 * 5/1999 Sun ...................................... 438/682

* cited by examiner

Primary Examiner—Charles Bowers
Assistant Examiner—Craig Thompson
(74) Attorney, Agent, or Firm—Daryl K. Neff; Todd M. C. Li

(57) ABSTRACT

A method for simultaneously forming a line interconnect such as a bitline and a borderless contact to diffusion, e.g. bitline contact, is described. A semiconductor substrate having prepatterned gate stacks thereon is covered with a first dielectric to form a first level and then a second dielectric is deposited which forms a second level. Line interconnect openings are defined in the second level by lithography and etching. Etching is continued down to monocrystalline regions in an array region of the substrate to form borderless contact openings coincident to the line interconnects between the gate stacks. The openings are filled with one or more conductors to form contacts to diffusion, e.g. bitline contacts, which are coincident to the line interconnects, e.g. bitlines.

14 Claims, 2 Drawing Sheets

METHOD OF SIMULTANEOUSLY FORMING A LINE INTERCONNECT AND A BORDERLESS CONTACT TO DIFFUSION

FIELD OF THE INVENTION

The present invention relates to semiconductor processing and more specifically to front end of line (FEOL) methods for defining interconnects.

BACKGROUND OF THE INVENTION

Heretofore, in memory devices, especially DRAMs (dynamic random access memories) and logic chips having embedded DRAMs (eDRAMs), the process of fabricating bitline contacts to diffusion (CB contacts) has required lithography using a critical mask. Fabricating the bitlines themselves has required lithography using another critical mask. Critical mask lithography is expensive and error-prone due to attendant optical and alignment factors. Therefore, it would be desirable to simultaneously fabricate bitlines and bitline contacts to diffusion using the same critical mask. In the description of the invention that follows, those skilled in the art will recognize that bitlines are a specific example of a line interconnect, and bitline contacts are a specific example of contacts to diffusion.

Many semiconductor chips have array regions and support regions. The array regions may include densely packed devices that form a memory array for a DRAM or an eDRAM, while the support regions include less densely packed devices, typically logic, which may be optimized for speed, performance or power conservation. The different design goals for the array region and the support region require that different processing be applied to the respective regions. However, to reduce the cost of manufacturing such chips, it is desirable to combine the processing for both the array and the support regions, when certain steps can be performed which advance the design goals for both regions.

Accordingly, it is an object of the invention to provide a method of simultaneously defining line interconnects, e.g. bitlines, and contacts to diffusion, e.g. bitline contacts.

Another object of the invention is to provide a method of defining line interconnects and contacts to diffusion while requiring only one critical mask.

Still another object of the invention is to provide a method of simultaneously defining line interconnects, e.g. bitlines, array contacts to diffusion, e.g. bitline contacts, and support contacts to diffusion.

SUMMARY OF THE INVENTION

These and other objects are provided by the method of the present invention of simultaneously defining a line interconnect and borderless contacts to diffusion coincident thereto.

A semiconductor substrate having prepatterned gate stacks thereon is covered with a first dielectric to form a first level and then a second dielectric is deposited thereon which forms a second level. Line interconnect openings are defined in the second level by lithography and etching. Etching is continued down to monocrystalline regions in an array region of the substrate to form borderless contact to diffusion openings between the gate stacks which are coincident to the line interconnect openings. The openings are then filled with one or more conductors, preferably with polysilicon in the lower borderless openings, and preferably with a metal in the line interconnect openings above.

Preferably, the method herein is carried out simultaneously with respect to fabricating line interconnects and contacts to support (CS) in a support region of the substrate. The method begins with a semiconductor substrate having prepatterned gate stacks thereon which are covered with a first dielectric to form a first level. An etch stop layer is then formed over the first level in the support region but not in the array region. A second dielectric (MO level) layer is deposited over both array and support regions. Line interconnect openings are then made in both array and support regions. Etching is continued, selective to the etch stop layer, thereby forming borderless contact to diffusion openings between the gate stacks in the array region while leaving the first level in the support region intact.

The etch stop layer is then removed from the support region. A contact to diffusion conductor, preferably polysilicon, is deposited in the lower borderless openings and then removed from the line interconnect openings above. Alternatively, ion implantation can be performed at this point, allowing the polysilicon deposition and etchback to be skipped.

Then, in the support region, contacts to diffusion openings are defined and etched coincident to the line interconnects. Finally, a metal, such as tungsten, is then deposited to fill the openings, thereby forming array contacts to diffusion (e.g. bitline contacts), if not already formed by a prior polysilicon deposition, and line interconnects (e.g. bitlines) in the array region. The metal deposition simultaneously forms the support contacts to diffusion (CS) and line interconnects in a support region (e.g. as logic interconnects).

DETAILED DESCRIPTION OF THE PREFERRED EMBODIMENTS

Figure 1:
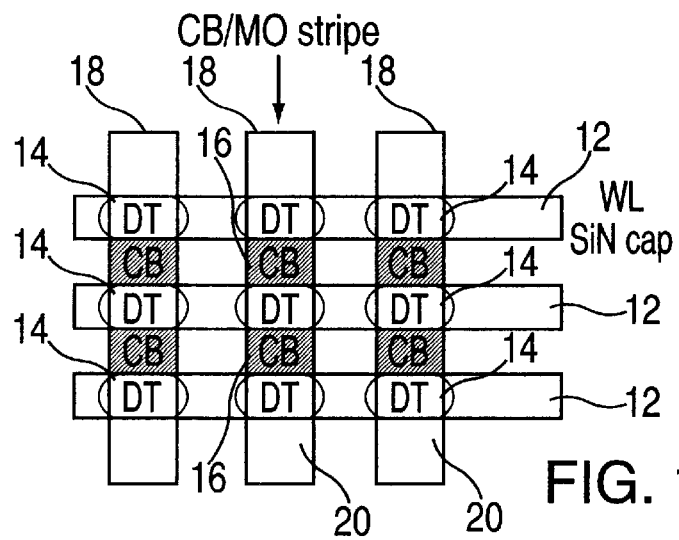
FIG. 1 is a top view of a DRAM array illustrating the location of bitline contacts to diffusion (CB) in a device constructed according to the method of the present invention.

FIG. 1 is a top view of a DRAM array illustrating the location of bitline contacts to diffusion (CB) in a device constructed according to the method of the present invention. As illustrated in FIG. 1, a plurality of gate stacks 12 used as wordlines run horizontally across the array over deep trenches 14. Each deep trench 14 includes a storage capacitor (not shown) in a lower portion and a vertical transistor in an upper portion. The vertical transistor includes a node diffusion (not shown) and a channel region (not shown) in the monocrystalline substrate which are vertically aligned with the sidewall of the trench. The vertical transistor also includes a bitline diffusion 49 (FIG. 2) adjacent thereto and extending into the horizontal surface plane of the monocrystalline substrate. The bitline diffusion 49 lies in the monocrystalline substrate coincident to a bitline contact (CB) 16.

The active area of the DRAM array is defined as horizontal stripes 18 running transverse to the wordlines 12 on the semiconductor surface. The stripes 18 define the location of bitline contacts (CB) 16 which occupy the spaces between adjacent wordlines 12, and define the location of the bitlines 20 which extend as lines in a dielectric level above the wordlines 12.

Figure 2:
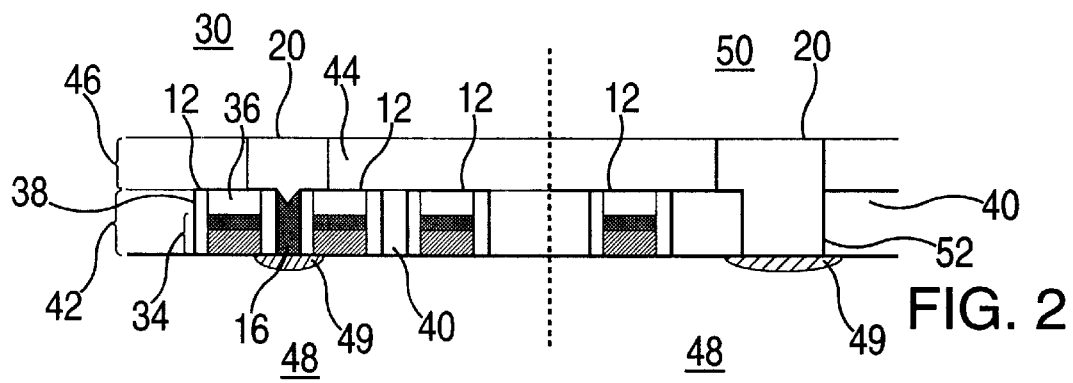
FIG. 2 is a cross-sectional view of a combined array and support device constructed according to the method of the present invention.

FIG. 2 is a cross-sectional view illustrating a combined array and support device constructed according to the method of the present invention. In FIG. 2, as in FIGS. 3–8 referenced below, the true direction in which the bitlines 20 extend in the horizontal plane is not shown. In order to best illustrate the principles of the invention and avoid the confusion of showing multiple cross-sections for each step in the process, the bitlines are shown in FIGS. 2–8 extending in a direction which is rotated 90 degrees from their true horizontal direction. The top down view of FIG. 1 will serve as a reference for the true direction of bitline extension throughout the description of the invention to follow.

As shown in FIG. 2, an array region 30 includes a plurality of gate stacks 12 which include gate conductors 34 covered by insulating caps 36 and insulating sidewalls 38. Preferably, the insulating caps 36 and insulating sidewalls 38 are formed of deposited silicon nitride by a process which is well understood by those skilled in the art. The gate stacks 12 are covered by a first dielectric 40 in a first level 42, and a second dielectric 44 in a second level 46. The bitline contact (CB) 16 extends from a bitline 20 in the second level 46 to the monocrystalline region 48 of the substrate. At the location of the bitline contact 16 in the substrate 48 there is a region 49 of locally high dopant ion concentration known as a diffusion 49. The bitline contact 16 electrically connects the bitline 20 to a diffusion 49 in the substrate 48. The bitline contact 16 is borderless to the gate stacks 12 in that the only isolation between the bitline contact 16 and the gate conductors 34 is the insulated caps 36 and the insulated sidewalls 38 of the gate stacks 12 that flank the bitline contact 16.

In the support region 50 there are also gate stacks 12, although typically not as closely spaced as in the array region. The gate stacks 12 are covered by insulating caps 36 and insulating sidewalls 38, which again, are preferably made of deposited silicon nitride. In the support region 50, a contact to support (CS) 52 extends between an MO line interconnect 20 in a second level 46 and a diffusion 49 in the substrate 48. However, in the support region 50 the CS contact 52 is not borderless to gate stacks 12. Rather, the CS contact 52 is isolated from gate stacks 12 by isolating dielectric material 40 having photolitho-graphically defined dimensions.

Figure 3:
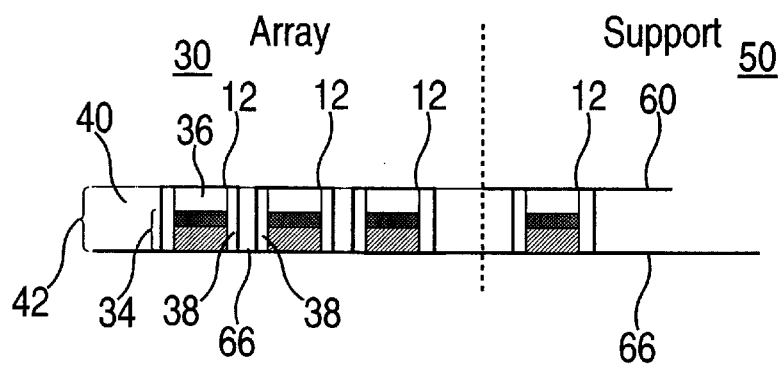
FIGS. 3–8 are cross-sectional views illustrating structures which result according to various acts which are performed according to the present invention.

A process which results in the above-described structure is described now, with reference to FIGS. 3–8. As illustrated in FIG. 3, gate stacks 12 are formed on a monocrystalline substrate 48 having gate conductors 34 (herein shown as preferred two-layer gate conductors such as lower level of polysilicon, upper level of tungsten silicide or tungsten nitride/tungsten), insulating caps 36 and insulating sidewalls 38. The insulating caps 36 and insulating sidewalls 38 are preferably comprised of deposited silicon nitride. From the description of the invention to follow, those skilled in the art will understand that the material of caps 36 and sidewalls 38 need only be insulating and comprised of a material which has a suitable etch selectivity versus a dielectric material 40 which is deposited therebetween to form a first dielectric layer 42. At some time prior to depositing dielectric material 40, a liner material 66 is deposited on the surface of the substrate 48, a function of which will be described in the description to follow. Dielectric material 40 of layer 42 is preferably a doped deposited glass material such as borosilicate (BSG) or phospho-silicate glass (PSG), and most preferably, borophosphosilicate glass (BPSG).

After forming gate stacks 12 and first dielectric layer 42, an etch stop layer 60, preferably comprised of silicon nitride, is formed over the first dielectric layer in the support region 50. Again, those skilled in the art reading the description of the invention that follows will understand that other suitable etch stop materials could be substituted for silicon nitride as the etch stop layer 60. Preferably, the etch stop layer 60 is formed in the support region 50 by depositing an etch stop material over the patterned substrate, then depositing and patterning a block mask over the support region 50, then etching away the etch stop layer in the array region 30.

Figure 4:
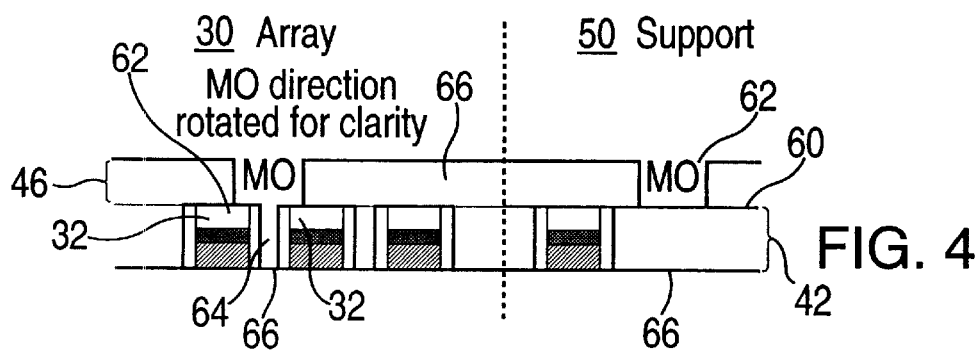

Referring to FIG. 4, a second dielectric layer 46, also referred to as an MO layer 46 is then formed by depositing an interlevel dielectric 44, preferably from a TEOS precursor. Line interconnect patterns are then defined by photolithography and line interconnect openings 62 are etched into the MO layer 46. As noted above, the true direction in which the line interconnect openings 62 extend is not shown. As shown, the direction has been rotated by 90 degrees in the horizontal plane for clarity of description. Etching is continued, selective to the material of the etch stop layer 60, such that borderless openings 64 are formed in the array region 30 between adjacent gate stacks. In borderless openings 64 of array region 30 the etching stops upon liner 66. In the support region 50, the etch stop layer 60 protects the integrity of the first dielectric layer 42.

Figure 5:
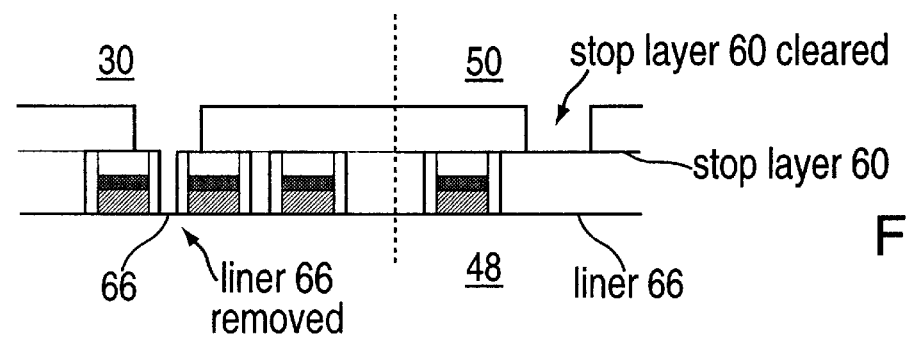

With reference to FIG. 5, the etch stop layer 60 is then cleared from the support region 50, as by a timed wet etch or a reactive ion etch (RIE). Preferably, the etch stop layer 60 is comprised of the same material of which the liner 66 is comprised, such that both the etch stop layer 60 and the liner 66 are removed by the same processing. Most preferably, the etch stop layer 60 and the liner 66 are both comprised of silicon nitride, such that both are removed by one timed etch or etch endpointing on underlying oxide or silicon.

Figure 6:
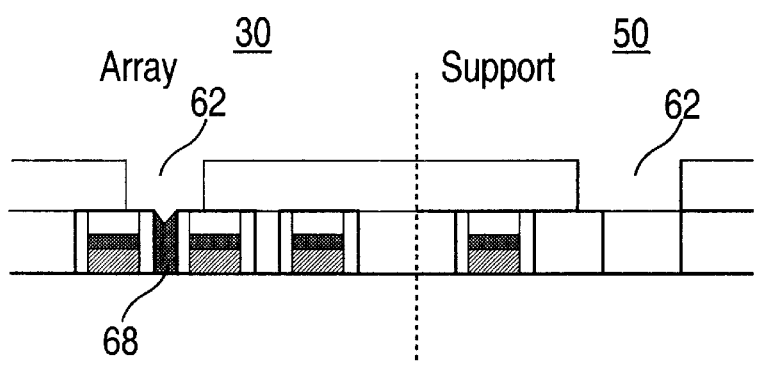

Next, as illustrated in FIG. 6, polysilicon 68 is deposited to fill borderless openings 64. The polysilicon 68 is then cleared from all areas except within the borderless openings 64, as by a timed RIE etch. As a result, polysilicon is removed from line interconnect openings 62 in the MO level 46 in both the array region 30 and the support region 50.

Alternatively, the above-described process of depositing polysilicon and etching back could be skipped by performing an ion implantation at this point, which would form diffusions 49 (See FIG. 2) only under the borderless openings 64. The borderless openings 64 could then remain unfilled until the conductor deposition described below with reference to FIG. 8. Following a deposition of tungsten, a preferred conductor metal, as described below, low resistance tungsten bitline contacts would be formed.

Figure 7:
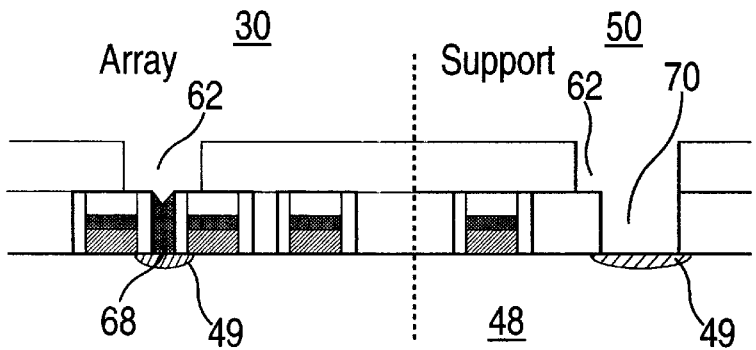
Figure 8:
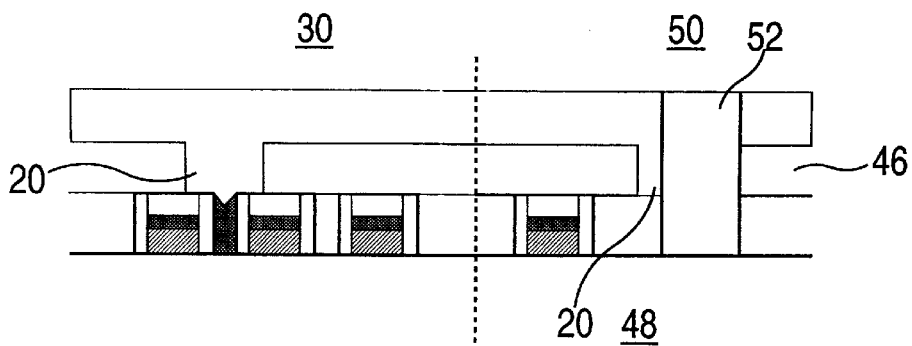

Referring to FIG. 7, a contact to support (CS) opening 70 is defined by photolithography and etched such that the CS opening 70 extends from the line interconnect opening 62 in support region 50 to the substrate 48. Preferably, at this time, diffusion regions 49 will be formed in the substrate 48 by implantation of dopant ions, if not already formed by the alternative array implantation process described above. Finally, with reference to FIG. 8, a conductor, preferably an MO metal, and more preferably tungsten, is deposited to fill line interconnect openings 62 in both the array region 30 and the support region 50, the support contact openings 70, and the borderless openings 64, if not already filled by prior polysilicon deposition (FIG. 6). Excess conductor material which overlays the MO dielectric layer 46 is removed, preferably by planarization, and more preferably by a chemical mechanical polishing (CMP) process.

Accordingly, a structure as shown in FIG. 2 results from the above-described simultaneous definition of bitlines 20 and bitline contacts 16 in the array region 30. Moreover, the above-described process allows for simultaneous formation of line interconnects 20 and contacts to support (CS) 52 in the support region 50.

While the invention has been described with reference to certain preferred embodiments thereof, those skilled in the art will recognize the many modifications and enhancements which can be made without departing from the true scope and spirit of the appended claims.

What is claimed is:

1. A method of simultaneously defining a line interconnect and borderless contacts to diffusion coincident to said line interconnect, comprising:

obtaining a semiconductor substrate including an array region having prepatterned gate stacks over which a first dielectric has been deposited to form a first level, each said gate stack having an insulating cap and insulating sidewalls comprising a material having a different etch selectivity than said first dielectric, said substrate further including monocrystalline regions underlying said prepatterned gate stacks;

depositing a second dielectric over said array region to form a second level;

lithographically defining and etching a line interconnect opening in said second level;

continuing etching down to said monocrystalline regions to form openings in said first level which are borderless to said prepatterned gate stacks; and depositing a conductor in said openings to form said borderless contacts to diffusion (CD) and said line interconnect.

2. The method according to claim 1 wherein said line interconnect is a bitline.

3. The method according to claim 1 wherein said insulating cap material comprises a nitride.

4. The method according to claim 3 wherein said semiconductor substrate further includes a liner underlying said first dielectric over said monocrystalline regions, and said continuing etching comprises first etching, selective to a material of said liner, then clearing said liner from said borderless openings.

5. The method according to claim 4 wherein said liner is comprised of silicon nitride.

6. A method of simultaneously defining line interconnects, borderless array contacts to diffusion and support contacts to diffusion coincident to said line interconnects, comprising:

obtaining a semiconductor substrate including an array region having prepatterned gate stacks over which a first dielectric has been deposited to form a first level, each said gate stack having an insulating cap and insulating sidewalls comprising a material having a different etch selectivity than said first dielectric, said array region further including monocrystalline regions located between said prepatterned gate stacks, said substrate further including a support region separate from said array region;

planarizing said first dielectric to said insulating cap;

depositing an etch stop layer over said support region;

depositing a second dielectric over said array region and said support region to form a second level;

lithographically defining and etching line interconnect openings in said second level in both said array region and said support region;

continuing etching, selective to said material of said insulating cap and selective to said etch stop layer, down to said monocrystalline regions to form openings in said first level in said array region which are borderless to said prepatterned gate stacks and coincident to said line interconnect openings;

removing said etch stop layer;

forming contacts to support (CS) openings in said support region;

depositing one or more conductors in said borderless openings and said contacts to support openings and said line interconect openings, thereby forming said line interconnects, said borderless array contacts to diffusion and said support contacts to diffusion.

7. The method according to claim 6 wherein said etch stop layer is deposited over said support region and said array region and then cleared from said array region.

8. The method according to claim 6 wherein said line interconnect in said array region is a bitline.

9. The method according to claim 6 wherein said insulating cap material comprises silicon nitride.

10. The method according to claim 9 wherein said semiconductor substrate further includes a liner comprising silicon nitride underlying said first dielectric over said monocrystalline regions, and said continuing etching comprises first etching, selective to silicon nitride, to said nitride liner, and then removing said liner from said borderless openings.

11. The method according to claim 10 wherein said etch stop layer includes silicon nitride and said removing said liner also removes said etch stop layer.

12. The method according to claim 6 wherein said depositing one or more conductors includes first depositing polysilicon, then depositing a metal.

13. The method according to claim 6 wherein said line interconnect openings are patterned in a direction generally transverse to the direction of said prepatterned gate stacks.

14. A method of simultaneously defining line interconnects including bitlines, borderless array bitline contacts to diffusion and support contacts to diffusion coincident to said line interconnects, comprising:

obtaining a semiconductor substrate including an array region having prepatterned gate stacks over which a first dielectric of doped glass has been deposited to form a first level, each said gate stack having an insulating cap and insulating sidewalls comprising silicon nitride, said array region further including monocrystalline regions underlying said prepatterned gate stacks and a liner including silicon nitride underlying said first dielectric over said monocrystalline regions, said substrate further including a support region separate from said array region;

planarizing said first dielectric to said insulating cap;

depositing a nitride layer over said support region;

depositing a second dielectric over said array region and said support region to form a second level;

lithographically defining and etching line interconnect openings in said second level in said array region and in said support region;

continuing etching, selective to nitride, to form bitline contact openings in said first level in said array region which are borderless to said prepatterned gate stacks and coincident to said line interconnect openings;

removing said nitride layer and said nitride liner;

in said support region, lithographically defining and etching support contact to diffusion openings in said first and second levels coincident to at least some of said line interconnect openings;

depositing one or more conductors in said line interconnect openings, said bitline contact openings, and said support contact to diffusion openings; and planarizing said one or more conductors to a dielectric surface of said second level.

* * * * *

UNITED STATES PATENT AND TRADEMARK OFFICE
CERTIFICATE OF CORRECTION

PATENT NO. : 6,245,651 B1 Page 1 of 1
APPLICATION NO. : 09/481916
DATED : June 12, 2001
INVENTOR(S) : Rama Divakaruni, Larry Alan Nesbit and Carl John Radens It is certified that error appears in the above-identified patent and that said Letters Patent is hereby corrected as shown below:

(73) Assignee: International Business Machines Corporation, Armonk, NY (US)

Signed and Sealed this

Twelfth Day of September, 2006

JON W. DUDAS
*Director of the United States Patent and Trademark Office*